(12) United States Patent
Klaus

(10) Patent No.: US 6,667,898 B2
(45) Date of Patent: Dec. 23, 2003

(54) METHOD FOR MEASURING BIAS VOLTAGE OF SENSE AMPLIFIER IN MEMORY DEVICE

(75) Inventor: Matthias Klaus, Hsinchu (TW)

(73) Assignee: Promos Technologies, Inc. (TW)

( * ) Notice: Subject to any disclaimer, the term of this patent is extended or adjusted under 35 U.S.C. 154(b) by 0 days.

(21) Appl. No.: 10/189,506

(22) Filed: Jul. 8, 2002

(65) Prior Publication Data

US 2003/0161176 A1 Aug. 28, 2003

(30) Foreign Application Priority Data

Feb. 25, 2002 (TW) .......................................... 91103356

(51) Int. Cl.[7] .............................................. G11C 11/24
(52) U.S. Cl. .................. 365/149; 365/189.07; 365/205
(58) Field of Search ................................. 365/149, 203, 365/222, 204, 205, 208, 189.01, 189.07

(56) References Cited

U.S. PATENT DOCUMENTS 4,958,325 A * 9/1990 Nakagome et al. ......... 365/206
6,563,743 B2 * 5/2003 Hanzawa et al. ...... 365/189.02

* cited by examiner

*Primary Examiner*—Gene Auduong
(74) *Attorney, Agent, or Firm*—Arent Fox Kintner Plotkin & Kahn

(57) ABSTRACT

A method for measuring a bias voltage of plural sense amplifiers in a memory device is provided. The method includes the steps of: selecting the plural sense amplifiers as a measurement area, writing a midlevel voltage into the respective memory cell modules connected to the plural the sense amplifiers respectively, providing a reference voltage of the midlevel voltage into the plural sense amplifiers in the measurement area, recording output signals of the plural sense amplifiers, wherein the output signal is valued one of "0" and "1", counting numbers of "0" and "1", and obtaining a ratio of the number of "0" over the number of "1", and obtaining the bias voltage of the plural sense amplifiers in the measurement area as the ratio.

12 Claims, 5 Drawing Sheets

METHOD FOR MEASURING BIAS VOLTAGE OF SENSE AMPLIFIER IN MEMORY DEVICE

FIELD OF THE INVENTION

The present invention is related to a method for measuring the bias voltage, and more particularly, to a method for measuring the bias voltage of the sense amplifier in a memory device.

BACKGROUND OF THE INVENTION

The memory device is the place where the programs and the information are temporarily saved in a computer. Generally speaking, the memory device is divided into two types, the read-only memory (ROM) and the random access memory (RAM). The RAM is the place for saving the operating system and application program. Basically, all programs must loaded into RAM to run correctly. The RAM is divided into two types, the dynamic random access memory (DRAM) and the static random access memory (SRAM). The basic structure of DRAM uses two electrical elements including a transistor and a capacitor to form a memory cell module. The information of one bit is saved according to the charged status of the capacitor in the memory cell module. However, the capacitor in DRAM structure will be discharged automatically. Therefore, an extra circuit is designed for regularly examining the voltage of the capacitor so that the capacitor can be charged or discharged to prevent from losing information. This is what we call "memory refresh." Because the DRAM has to proceed with the memory refresh continuously, it is called "dynamic" random access memory.

In fact, the DRAM unit is a series connection of a simple transistor and a capacitor. The capacitor is used for saving the electric charge which represents the information. The transistor is used for controlling the access mechanism of internal electric charge in the capacitance. Please refer to FIG. 1. FIG. 1 is a diagram illustrating the structure of the DRAM unit according to the prior art. Take N channel as an example, the method which DRAM records and reads the internal information is described as following:

1. writing "1" signal:

When writing "1" into the DRAM, a positive bias voltage is applied to the plate 3 of the capacitor 1 to make the semiconductor 6 surface layer beneath the capacitor 1 reverse polarity thereof. Meantime, the positive bias voltage is applied to both the word line (WL) 4 and bit line (BL) 5 under the circumstance that the transistor 2 (it is also a metal-oxide semiconductor (MOS)) is electrically conducted. The electric charges of the reverse layer formed because of the polarity reversion in the capacitor 1 flow to the bit line (BL) 5 then and leave the electric charges of the empty layer beneath the capacitor 1. The signal saved in the DRAM unit now is called "1."

After "1" is written, the capacitor 1 is under a heat-unbalanced status. This is because the location beneath capacitor 1 is under the polarity reversion status without the reverse layer, which causes a heat-unbalanced situation. At this time, any electron formed by every kinds of energies from outside might try flowing to this area and try reaching the heat-balanced status, which will result in the damage of the signal saved in the capacitor 1. Therefore, the memory refresh must be proceeded regularly in the DRAM unit to keep the signal of the electrical charge. This is why it is called "dynamic."

2. writing "0" signal:

While the capacitor 1 is under the heat-balanced status, the memory refresh proceeded when writing "1" into DRAM needs not to proceeded. In other words, the memory refresh in the DRAM is mainly used for maintaining the "1" signal.

3. Reading "1" and "0" signals

When reading the signal saved in the memory cell, the bit line (BL) will be switched to a comparator circuit. The word line (WL) will be then accept the positive bias voltage so that the signal saved in the capacitor 1 can connect with the BL directly. The signal of BL will be compared with a reference voltage through the comparator circuit and the purpose of judging the saved information will be achieved. Apparently, when "1" signal is read, it means the electric potential at BL is larger than the reference voltage. On the contrary, when "0" signal is read, it means the electric potential at BL is smaller than the reference voltage.

From the above description, the capacitor is known as the main storage in a DRAM unit. The larger capacitor a DRAM has, the longer period it needs for refreshing memory regularly. Besides, the larger capacitor a DRAM has, the harder that the storage information is interfered by the outside. However, the storage status in the capacitor is controlled by the change of the bias voltage. It is therefore that how to control the input bias voltage effectively has become the main purpose of the present invention. Thus, a method for measuring the bias voltage in a memory device is provided to control the bias voltage effectively.

SUMMARY OF THE INVENTION

The main purpose of the present invention is to provide a method for measuring the bias voltage of the sense amplifier in a memory device.

It is another object of the present invention to provide a method for measuring the bias voltage of the sense amplifier in a memory device. Through measuring the bias voltage, the bias voltage can be adjusted in good time so that an ideal output voltage can be obtained.

It is another object of the present invention to provide a method for measuring the bias voltage of the sense amplifier in a memory device. Through measuring the bias voltage, the accurate bias voltage can be obtained without wasting time and manpower.

According to an aspect of the present invention, the method for measuring the bias voltage of the sense amplifier in a memory device, wherein each of the plural sense amplifiers is electrically connected with a memory cell module, comprises the steps of: selecting the plural sense amplifiers as a measurement area, writing a midlevel voltage into the respective memory cell modules connected to the plural the sense amplifiers respectively, providing a reference voltage of the midlevel voltage into the plural sense amplifiers in the measurement area, recording output signals of the plural sense amplifiers, wherein the output signal is valued one of "0" and "1", counting numbers of "0" and "1", and obtaining a ratio of the number of "0" over the number of "1", and obtaining the bias voltage of the plural sense amplifiers in the measurement area as the ratio.

In accordance with the present invention, the memory device is a dynamic random access memory (DRAM).

Preferably, the midlevel voltage is an average voltage of a low input voltage $V_{SS}$ and a high input voltage $V_{DD}$.

Preferably, the reference voltage is an average voltage of a low input voltage $V_{SS}$ and a high input voltage $V_{DD}$.

Preferably, the ratio bigger than 0.5 represents that a biased level of the measurement area is too much close to the low input voltage $V_{DD}$.

Preferably, the ratio lower than 0.5 represents that a biased level of the measurement area is too much close to the high input voltage $V_{SS}$.

According to another aspect of the present invention, a method for measuring a bias voltage of a sense amplifier in a memory device, wherein the sense amplifier is electrically connected with a memory cell module, comprises the steps of: providing a reference voltage, writing a first voltage series starting from a high voltage to a low voltage into the memory cell module, reading output signals, being one of "0" and "1", of the sense amplifier in sequence in response to the first voltage series, recording an input voltage of the first voltage series as a third voltage when the output signal change from the "1" to the "0", writing a second voltage series starting from a low voltage to a high voltage into the memory cell module, reading output signals, being one of "0" and "1", of the sense amplifier in sequence in response to the second voltage series, recording an input voltage of the second voltage series as a fourth voltage when the output signal change from the "0" to the "1", and taking an average of the third voltage and the fourth voltage as a bias voltage for the sense amplifier.

In accordance with the present invention, the memory device is included in a dynamic random access memory (DRAM).

Preferably, the reference voltage is an average voltage of a low input voltage $V_{SS}$ and a high input voltage $V_{DD}$.

Preferably, the first voltage series is permuted according to an equal difference.

Preferably, the second voltage series is permuted according to an equal difference.

Preferably, the first voltage series and the second voltage series are both permuted with an equal difference and have the same equal difference.

The foregoing and other features and advantages of the present invention will be more clearly understood through the following descriptions with reference to the drawings, wherein:

DETAILED DESCRIPTION OF THE PREFERRED EMBODIMENT

Figure 1:
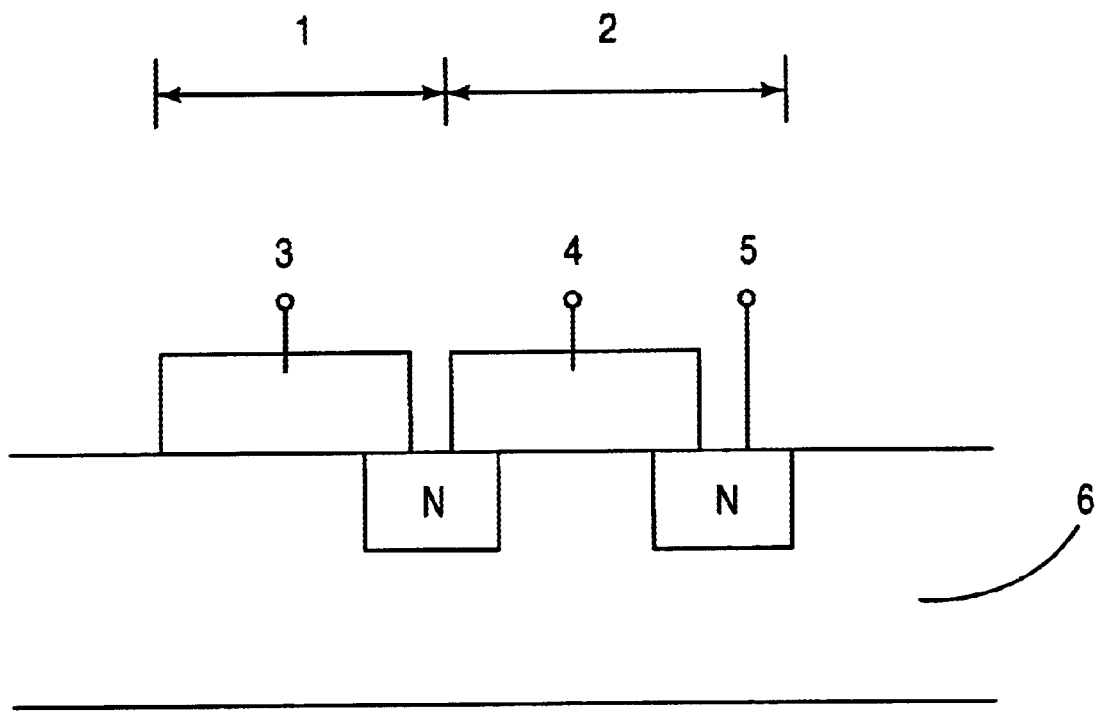
FIG. 1 is a diagram illustrating the structure of the DRAM unit according to the prior art.
Figure 2:
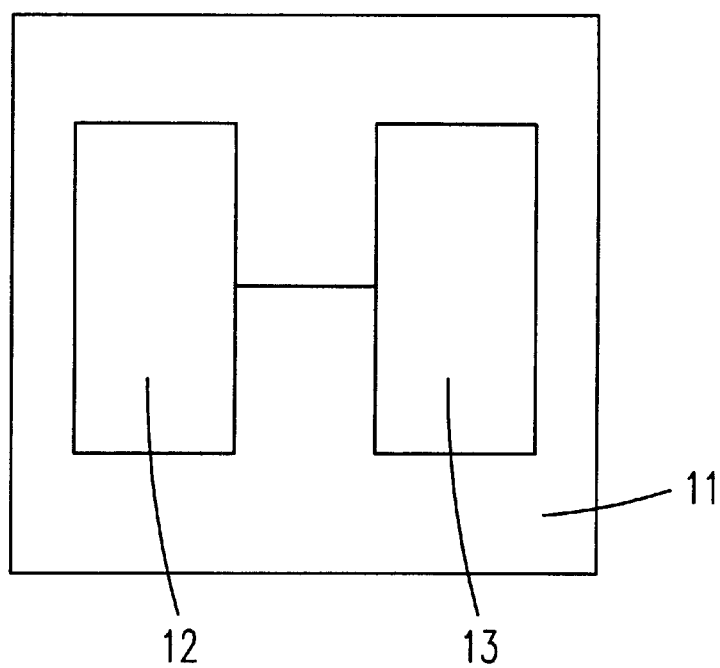
FIG. 2 is a diagram illustrating the internal connection in the DRAM according to a preferred embodiment of the present invention.

The present invention will now described more specifically with reference to the following embodiments. Please refer to FIG. 2. FIG. 2 is a diagram illustrating the internal connection in the DRAM according to a preferred embodiment of the present invention. A dynamic random access memory (DRAM) 11 includes a memory array 12 and plural sense amplifiers (SA) 13, wherein the memory array 12 further includes plural memory cell modules electrically connected with plural sense amplifiers (SA) 13.

Figure 3:
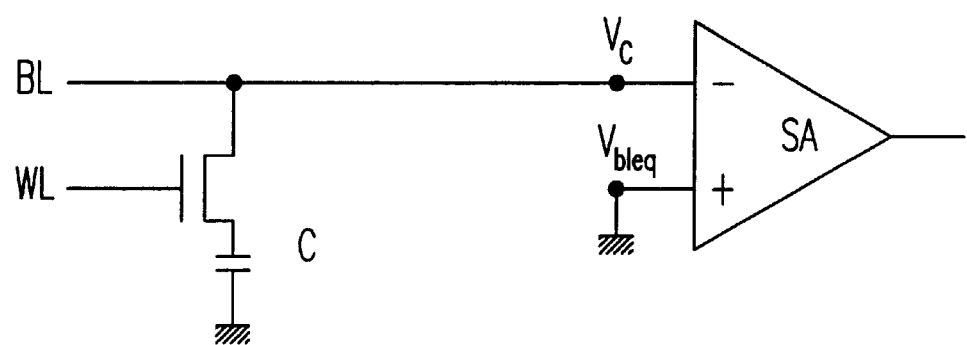
FIG. 3 is a diagram illustrating the circuit structure according to a preferred embodiment of the present invention.
Figure 4:
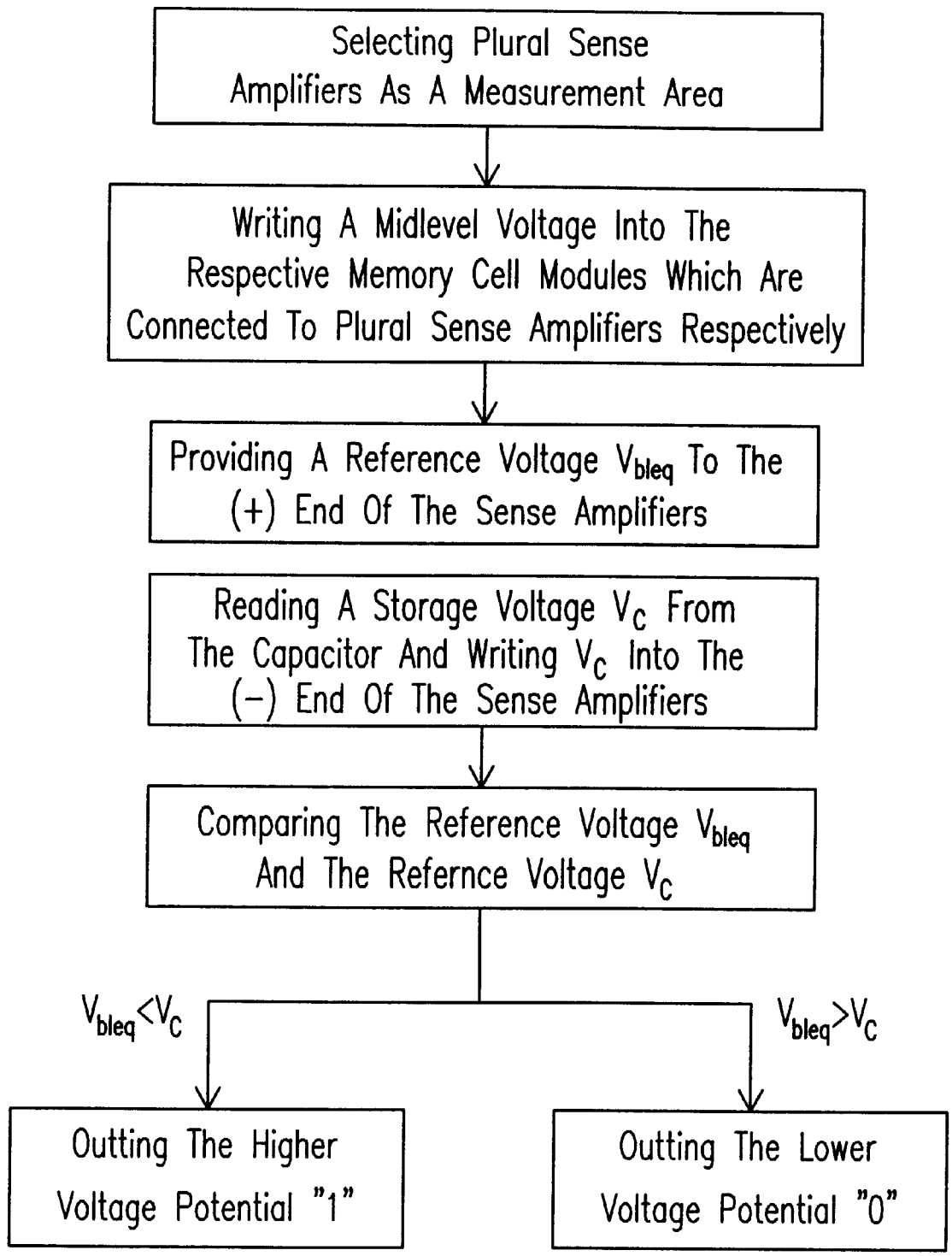
FIG. 4 is a flow chart illustrating the measuring method according to a preferred embodiment of the present invention.

Please refer to FIG. 3 and FIG. 4. FIG. 3 is a diagram illustrating the circuit structure, while FIG. 4 is a flow chart illustrating the measuring method according to a preferred embodiment of the present invention. The bias voltage potential is judged by the statistical method of the bias voltage as described in the following. First, plural sense amplifiers are selected from a particular measurement area as the measured group of the sense amplifiers. A midlevel voltage, which is the average voltage of a low input voltage $V_{SS}$ and a high input voltage $V_{DD}$, is set up and written into the respective memory cell modules connected to the plural sense amplifiers respectively. Then, the midlevel voltage is saved in the capacitor group C of the memory cell modules. Afterwards, a reference voltage $V_{bleq}$ in response to the midlevel voltage is provided into the (+) end of the sense amplifiers in the measurement area, wherein the reference voltage $V_{bleq}$ is an average voltage of a low input voltage $V_{SS}$ and a high input voltage $V_{DD}$. A storage voltage $V_C$ is read from the capacitor group and written into the (−) end of the sense amplifiers in the measurement area. When the storage voltage $V_C$ is larger than the reference voltage $V_{bleq}$, a group of higher voltage potential is output (as "1"). Contrarily, when the storage voltage $V_C$ is smaller than the reference voltage $V_{bleq}$, a group of lower voltage potential is output (as "0"). In other words, the group of higher voltage potential or the group of lower voltage potential will be output by comparing the storage voltage $V_C$ and the reference voltage $V_{bleq}$ respectively. Then, the output signals (as "1" or "0") of the sense amplifiers will be recorded. After counting the numbers of "1" signal and "0" signal respectively, the ratio of the number of "1" signal and the number of "0" signal is obtained and represents the bias voltage of plural sense amplifiers in the measurement area. When the ratio is larger than 0.5, it means that the biased level of the measurement area is too much close to the low input voltage $V_{SS}$. When the ratio is smaller than 0.5, it means that the biased level of the measurement area is too much close to the high input voltage $V_{DD}$.

Figure 5A:
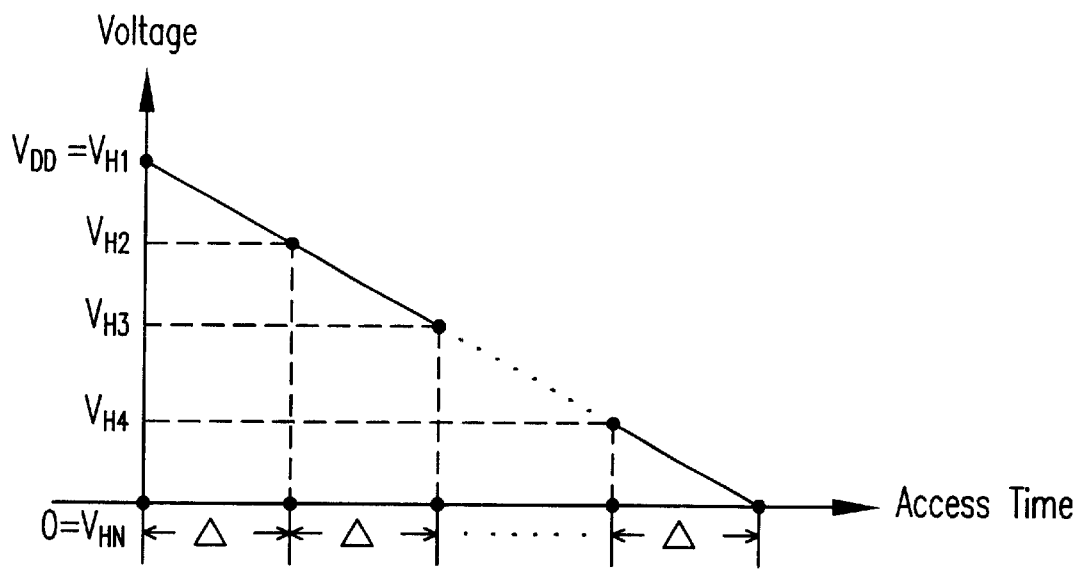
FIGS. 5(a) and (b) are the diagrams illustrating the relationship between the voltage and the access time according to a preferred embodiment of the present invention.
Figure 5B:
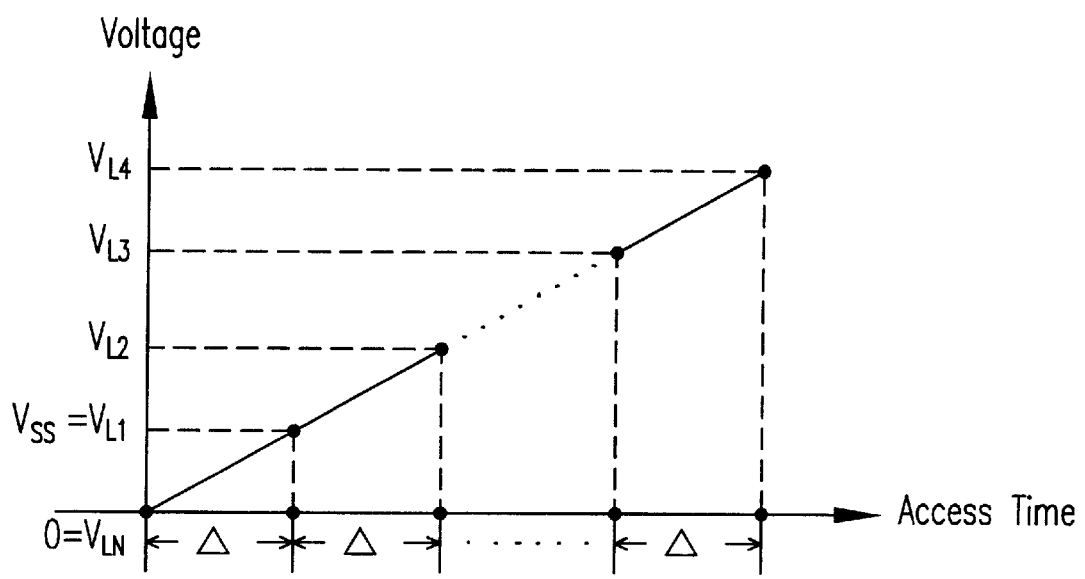
Figure 6:
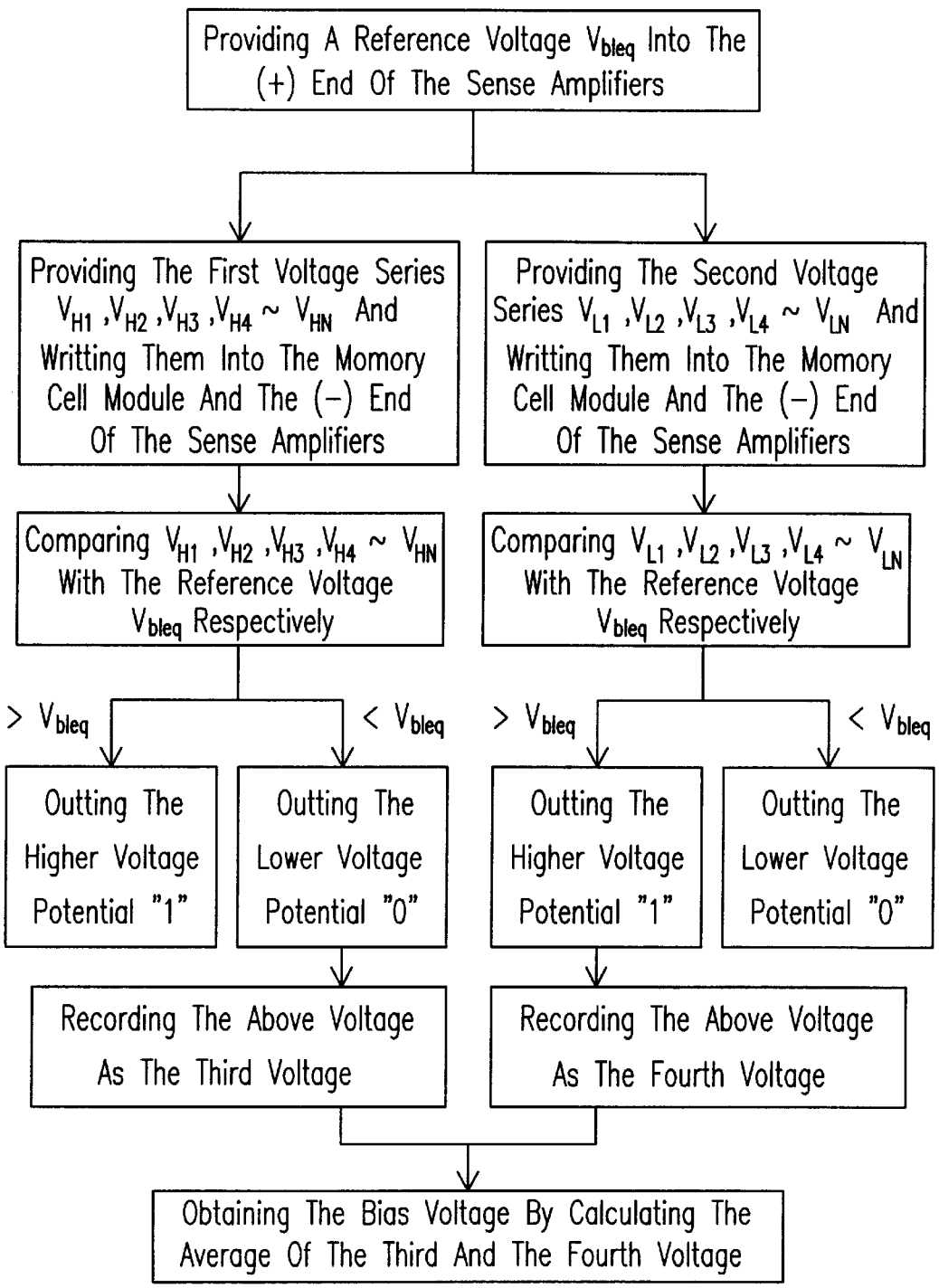
FIG. 6 is a flow chart illustrating the measuring method according to another preferred embodiment of the present invention.

Another preferred embodiment of the present invention is to provide another method for measuring a bias voltage of plural sense amplifiers in a memory device. Please refer to FIGS. 5(a), (b) and 6. FIGS. 5(a) and (b) are the diagrams illustrating the relationship between the voltage and the access time according to a preferred embodiment of the present invention, while FIG. 6 is a flow chart illustrating the measuring method according to another preferred embodiment of the present invention. First, a reference voltage $V_{bleq}$ is provided into the (+) end of the sense amplifiers in the measurement area (as shown in FIG. 3), wherein the reference voltage $V_{bleq}$ is an average voltage of a low input voltage $V_{SS}$ and a high input voltage $V_{DD}$. The first voltage series $V_{H1}$, $V_{H2}$, $V_{H3}$, $V_{H4} \sim V_{HN}$ starting from a high voltage to a low voltage, are written into the memory cell module, wherein the first voltage series is permuted according to an equal difference. Through the memory cell module, the first voltage series are input the (−) end of the sense amplifiers in the measurement area. Then, the first voltage series $V_{H1}$, $V_{H2}$, $VH_3$, $V_{H4} \sim V_{HN}$, are compared with the reference voltage $V_{bleq}$ respectively. When the above first voltage $V_H$ is larger than the reference voltage $V_{bleq}$, a higher voltage potential is output (as "1"). Contrarily, when the above first voltage $V_H$ is smaller than the reference voltage $V_{bleq}$, a lower voltage potential is output (as "0"). When the output signal changes from the higher voltage potential (as "1") to the lower voltage potential (as "0"), the input voltage of the first voltage series changed from "1" to "0" is recorded as the third voltage.

Afterwards, the second voltage series $V_{L1}$, $V_{L2}$, $V_{L3}$, $V_{L4}$~$V_{LN}$ starting from a low voltage to a high voltage, are written into the memory cell module, wherein the first voltage series is permuted according to an equal difference. The access time is as same as the access time A in the first voltage series. Through the memory cell module, the second voltage series are input the (−) end of the sense amplifiers in the measurement area. Then, the second voltage series $V_{L1}$, $V_{L2}$, $V_{L3}$, $V_{L4}$~$V_{LN}$, are compared with the reference voltage $V_{bleq}$ respectively. When the above second voltage series $V_L$ is smaller than the reference voltage $V_{bleq}$, a lower voltage potential is output (as "0"). Contrarily, when the above second voltage series $V_L$ is larger than the reference voltage $V_{bleq}$, a higher voltage potential is output (as "1"). When the output signal changes from the lower voltage potential (as "0") to the higher voltage potential (as "1"), the input voltage of the second voltage series changed from "0" to "1" is recorded as the fourth voltage. Finally, the average of the third voltage and the fourth voltage is obtained as the bias voltage for the measurement area.

From above, the method for measuring a bias voltage in the present invention provides a statistical method of the bias voltage, which could be used for judging the bias voltage potential in local area so that the time and manpower are both saved a lot. Also, the accurate bias voltage can be obtained by using the method in the present invention. Therefore, the present invention fits the needs of the industry and processes the developmental value.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for measuring a bias voltage of plural sense amplifiers in a memory device, wherein each of said plural sense amplifiers is electrically connected with a memory cell module, comprising steps of:

selecting said plural sense amplifiers as a measurement area;

writing a midlevel voltage into said respective memory cell modules connected to said plural sense amplifiers respectively;

providing a reference voltage of said midlevel voltage into said plural sense amplifiers in said measurement area;

recording output signals of said plural sense amplifiers, wherein said output signal is valued one of "0" and "1";

counting numbers of "0" and "1", and obtaining a ratio of said number of "0" over said number of "1"; and obtaining said bias voltage of said plural sense amplifiers in said measurement area as said ratio.

2. The method according to claim 1, wherein said memory device is a dynamic random access memory (DRAM).

3. The method according to claim 1, wherein said midlevel voltage is an average voltage of a low input voltage $V_{SS}$ and a high input voltage $V_{DD}$.

4. The method according to claim 1, wherein said reference voltage is an average voltage of a low input voltage $V_{SS}$ and a high input voltage $V_{DD}$.

5. The method according to claim 1, wherein said ratio bigger than 0.5 represents that a biased level of said measurement area is too much close to said low input voltage $V_{SS}$.

6. The method according to claim 1, wherein said ratio lower than 0.5 represents that a biased level of said measurement area is too much close to said high input voltage $V_{DD}$.

7. A method for measuring a bias voltage of a sense amplifier in a memory device, wherein said sense amplifier is electrically connected with a memory cell module, comprising steps of:

providing a reference voltage;

writing a first voltage series starting from a high voltage to a low voltage into said memory cell module;

reading output signals, being one of "0" and "1", of said sense amplifier in sequence in response to said first voltage series;

recording an input voltage of said first voltage series as a third voltage when said output signal change from said "1" to said "0";

writing a second voltage series starting from a low voltage to a high voltage into said memory cell module;

reading output signals, being one of "0" and "1", of said sense amplifier in sequence in response to said second voltage series;

recording an input voltage of said second voltage series as a fourth voltage when said output signal change from said "0" to said "1"; and taking an average of said third voltage and said fourth voltage as a bias voltage for said sense amplifier.

8. The method according to claim 7, wherein said memory device is included in a dynamic random access memory (DRAM).

9. The method according to claim 7, wherein said reference voltage is an average voltage of a low input voltage $V_{SS}$ and a high input voltage $V_{DD}$.

10. The method according to claim 7, wherein said first voltage series is permuted according to an equal difference.

11. The method according to claim 7, wherein said second voltage series is permuted according to an equal difference.

12. The method according to claim 7, wherein said first voltage series and said second voltage series are both permuted with an equal difference and have the same equal difference.

* * * * *